United States Patent
McCormack et al.

(10) Patent No.: US 7,635,621 B2
(45) Date of Patent: Dec. 22, 2009

(54) LATERAL DOUBLE-DIFFUSED METAL OXIDE SEMICONDUCTOR (LDMOS) DEVICE WITH AN ENHANCED DRIFT REGION THAT HAS AN IMPROVED $R_{on}$ AREA PRODUCT

(75) Inventors: Steve McCormack, Cupertino, CA (US); Ji-hyoung Yoo, Cupertino, CA (US)

(73) Assignee: Micrel, Inc., San Jose, CA (US)

( * ) Notice: Subject to any disclaimer, the term of this patent is extended or adjusted under 35 U.S.C. 154(b) by 565 days.

(21) Appl. No.: 11/411,359

(22) Filed: Apr. 25, 2006

(65) Prior Publication Data

US 2007/0246771 A1    Oct. 25, 2007

Related U.S. Application Data

(60) Division of application No. 10/623,095, filed on Jul. 17, 2003, now abandoned, which is a continuation-in-part of application No. 10/302,463, filed on Nov. 22, 2002, now abandoned.

(51) Int. Cl.
*H01L 21/8238* (2006.01)
(52) U.S. Cl. ............................ 438/202; 257/335
(58) Field of Classification Search ................ 438/202; 257/335
See application file for complete search history.

(56) References Cited

U.S. PATENT DOCUMENTS

| 4,300,150 | A | | 11/1981 | Colak ........................ 357/23 |
| 5,517,046 | A | | 5/1996 | Hsing et al. .................. 257/336 |
| 5,541,123 | A | * | 7/1996 | Williams et al. ............. 438/202 |
| 5,844,275 | A | | 12/1998 | Kitamura et al. ............ 257/335 |
| 5,846,866 | A | | 12/1998 | Huang et al. ................. 438/306 |
| 6,222,233 | B1 | | 4/2001 | D'Anna ....................... 257/343 |
| 6,399,468 | B2 | | 6/2002 | Nishibe et al. .............. 438/592 |
| 6,869,847 | B2 | | 3/2005 | Mori ........................... 438/286 |

FOREIGN PATENT DOCUMENTS

WO    WO 03/021685 A1    3/2003

\* cited by examiner

*Primary Examiner*—Douglas M Menz
(74) *Attorney, Agent, or Firm*—Sawyer Law Group P.C.

(57) ABSTRACT

A lateral double-diffused metal oxide semiconductor (LDMOS) device is disclosed. The LDMOS device comprises a gate region and a body region under the gate region. The LDMOS device includes an enhanced drift region under the gate region. The enhanced drift region touches the body region. By designing the device such that the enhanced drift region overlaps and compensates the lateral tail of the body region of the LDMOS transistor, the Ron*area product is reduced. Accordingly, the on-resistance is significantly reduced while minimally affecting the breakdown voltage of the device.

20 Claims, 5 Drawing Sheets

LATERAL DOUBLE-DIFFUSED METAL OXIDE SEMICONDUCTOR (LDMOS) DEVICE WITH AN ENHANCED DRIFT REGION THAT HAS AN IMPROVED $R_{on}$ AREA PRODUCT

CROSS REFERENCE TO RELATED APPLICATIONS

The present application is a divisional of U.S. patent application Ser. No. 10/623,095, filed Jul. 17, 2003 now abandoned, entitled, "Lateral Double-Diffused Metal Oxide Semiconductor (LDMOS) Device with an Enhanced Drift Region that has an Improved Ron*Area Product," which is a continuation-in-part of U.S. patent application Ser. No. 10/302,463, filed Nov. 22, 2002 now abandoned.

FIELD OF THE INVENTION

The present invention relates generally to lateral double-diffused metal oxide-semiconductors (LDMOS) transistors and more particularly to an improved LDMOS transistor having a high breakdown voltage and a low on resistance.

BACKGROUND OF THE INVENTION

Low on-resistance LDMOS transistors with high breakdown voltages are desirable for their low power loss in high voltage applications. It is well known in the art to increase breakdown voltage by increasing the distance between the drain region and the gate. However, increasing the distance between the drain region and the gate also undesirably increases the on-resistance of the LDMOS transistor.

FIG. 1 is a cross-sectional view of a conventional LDMOS transistor which serves to illustrate some of the causes of the increased on-resistance. In FIG. 1, a P substrate 10 has formed over it an N– epitaxial layer 11. On the surface of N– epitaxial layer 11 is formed an oxide layer 12, on which is formed a gate 13. In the surface of the N– epitaxial layer 11 are formed N+ drain region 14 and P body region 15. N+ source region 16 and P+ body contact region 17 are formed in P body region 15. Source contact 18 contacts both N+ source region 16 and P+ body contact region 17. Drain contact 19 contacts N+ drain region 14.

The distance between N+ drain region 14 and gate 13 directly affects both on-resistance and breakdown voltage. Since the N– epitaxial layer 11 between the N+ drain region 14 and the body region 15 (or gate 13) is only lightly doped, this layer 11 allows a relatively large depletion region to form between the regions 14 and 15 when the MOSFET is off, thus preventing a breakdown of the silicon between the regions 14 and 15. However, the N– epitaxial layer 11 presents a high resistance between the channel region and the drain region 14 when the MOSFET is turned on. Therefore, in the conventional LDMOS transistor, high breakdown voltage leads to high on-resistance.

U.S. Pat. No. 6,222,233, entitled "Lateral RF MOS Device with Improved Drain Structure," discusses a lateral DMOS with an enhanced drift region. Referring to FIG. 2, there is an enhanced drift region (under region 416) which just touches the DMOS body (422) of the LDMOS device. This device concept improves upon the limitations of the conventional device by removing a significant portion of the resistance of the underlying epi region. However, this device still has a higher Rdson*area product than desired, since the effective channel length is set by the depth and concentration of the body region (422).

U.S. Pat. No. 6,399,468, entitled "Semiconductor Device and Method of Manufacturing the Same," discusses an LDMOS device. Referring to FIG. 3 showing an LDMOS device, there is a region (106) which overlaps the DMOS body (105). This region is separate from the enhanced drift region (104). Since this region (106) is shallow and lightly doped, it is completely depleted during operation, and does not impact the effective channel length.

What is needed is a novel LDMOS transistor which has a low on-resistance while exhibiting a high breakdown voltage.

SUMMARY OF THE INVENTION

A lateral double-diffused metal oxide semiconductor (LDMOS) device is disclosed. The LDMOS device comprises a gate region and a body region under the gate region. The LDMOS device includes an enhanced drift region under the gate region. The enhanced drift region is designed to purposely overlap the body region, thereby setting the effective channel length of the LDMOS device.

By designing the LDMOS device such that the enhanced drift region overlaps and compensates the lateral tail of the body region of the LDMOS transistor, the Ron*area product is reduced. Accordingly, the on-resistance is significantly reduced while minimally affecting the breakdown voltage of the device.

DETAILED DESCRIPTION

The present invention relates generally to lateral double-diffused metal oxide-semiconductors (LDMOS) transistors and more particularly to an improved LDMOS transistor having a high breakdown voltage and a low on resistance. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

U.S. Pat. No. 5,517,046, issued to the assignee of the present application, discloses an LDMOS transistor which incorporates an enhanced drift region. In one embodiment, the transistor is formed in an N– epitaxial layer with a polysilicon gate, N+ source and drain regions, P body region, P+ body contact region, and an N enhanced drift region. The N enhanced drift region extends between the N+ drain region and the gate. The N enhanced drift region significantly lowers the on-resistance of the transistor, but surprisingly only slightly decreases the breakdown voltage, depending on the N enhanced drift region dose.

Although the above-identified LDMOS transistor operates effectively in many environments, it is still desirable to further reduce the on-resistance and to provide a lower Ron*area product. A system and method in accordance with the present invention accomplishes this by reducing the channel gate length such that the enhanced drift region purposely overlaps the P– body. In so doing, an improved LDMOS transistor is provided. For a more detailed explanation of the features of the present invention refer now to the following description in conjunction with the accompanying drawings.

Figure 1:
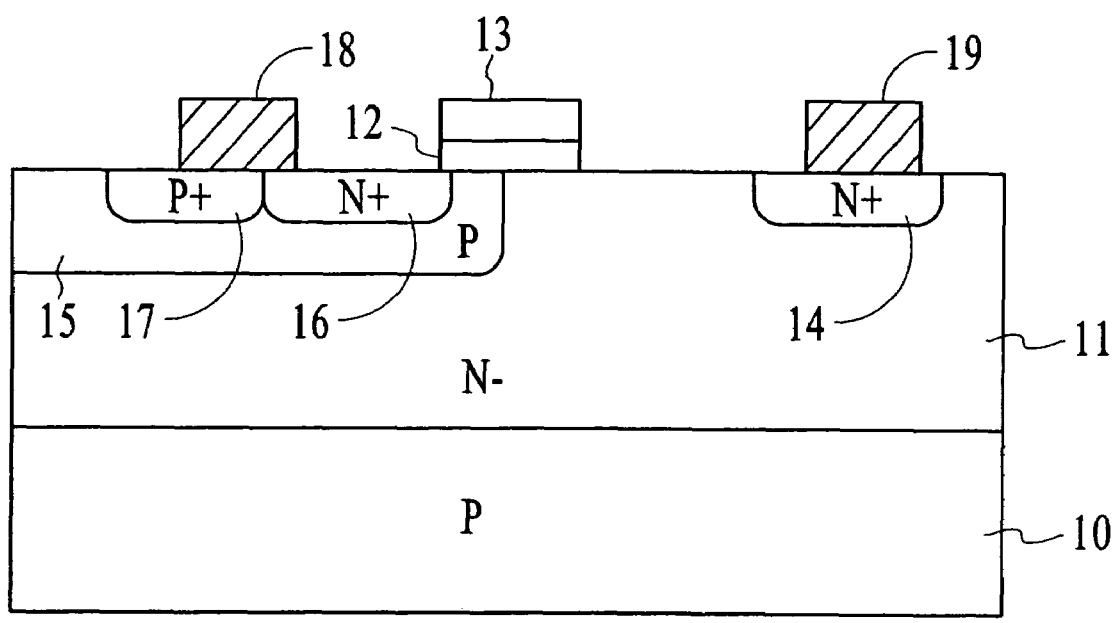
FIG. 1 is a cross-sectional view of a conventional LDMOS transistor.
Figure 2:
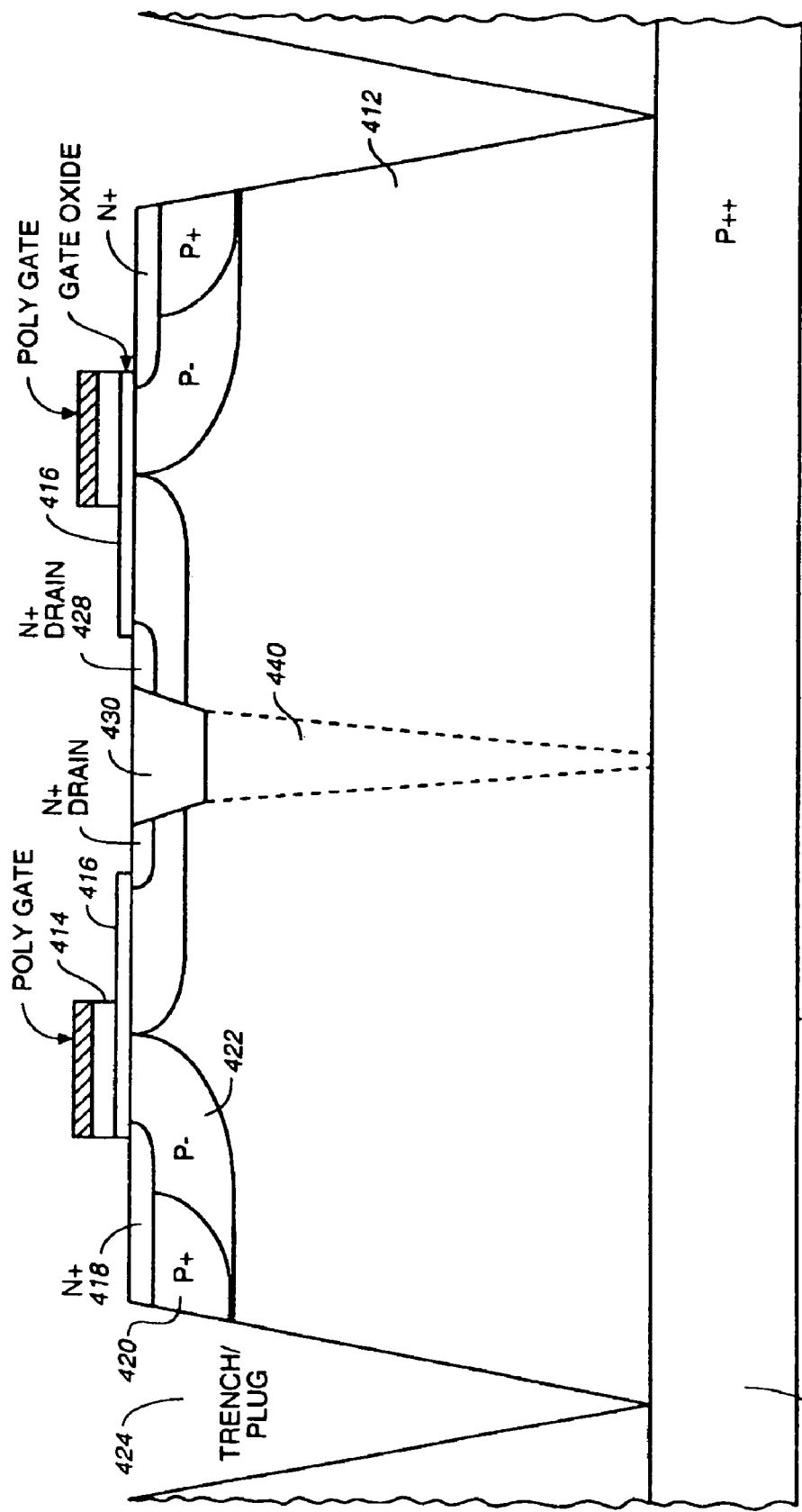
FIG. 2 illustrates a conventional LDMOS with an enhanced drift region.
Figure 3:
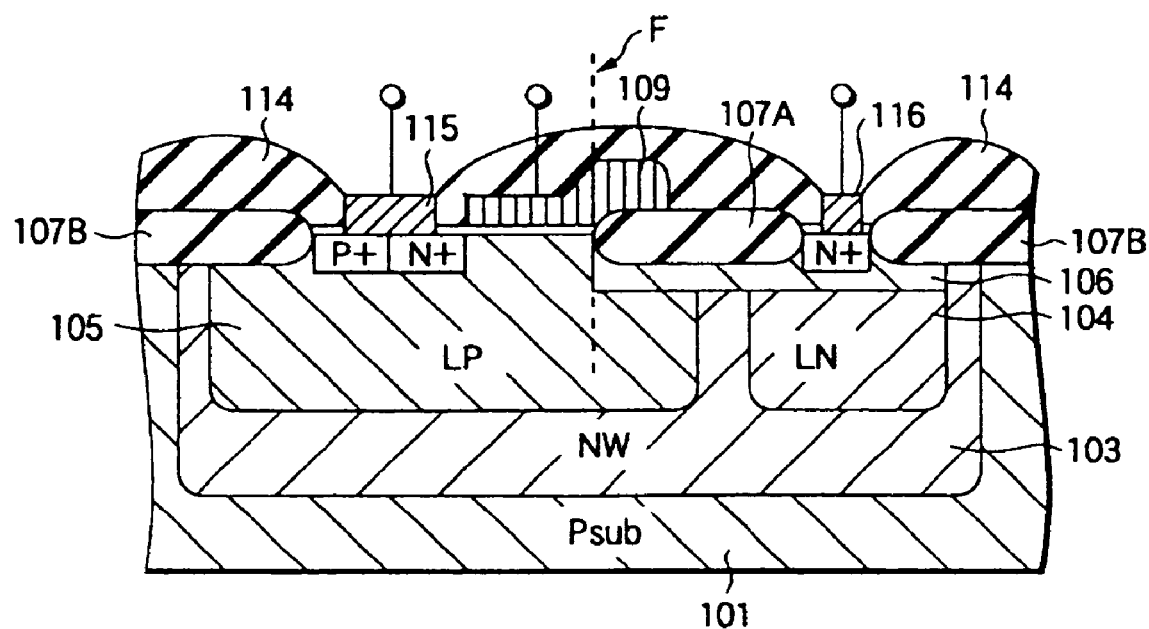
FIG. 3 illustrates another conventional LDMOS device.
Figure 4:
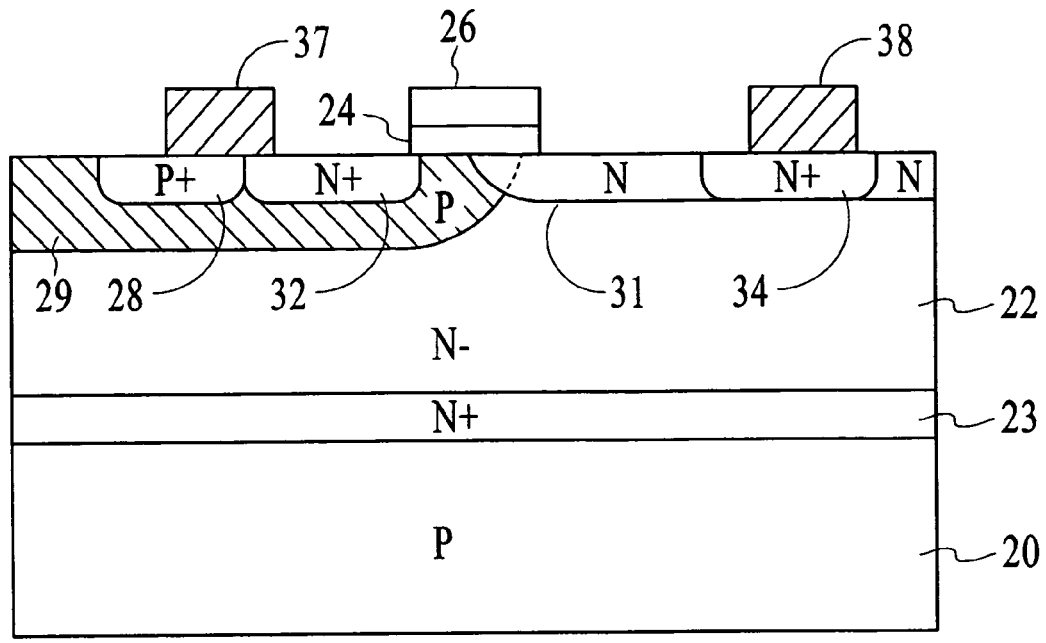
FIG. 4 illustrates the various regions and layers of a first embodiment of a LDMOS transistor in accordance with the present invention.

FIG. 4 illustrates the various regions and layers of an embodiment of a transistor in accordance with the present invention. The starting substrate in one embodiment is a P-type silicon substrate 20 having a resistivity of approximately 6 ohms-cm. An N– epitaxial layer 22 approximately 7.5 microns thick is then grown on the surface of the substrate 20 using conventional techniques. In one embodiment, the resistivity of epitaxial layer 22 is approximately 3.0 ohms-cm. Instead of forming the transistor in an N– epitaxial layer, the transistor may instead be formed in an N-well formed in the P-type substrate 20.

In an alternative embodiment, the substrate 20 may be an N-type silicon substrate. In this alternative embodiment, an epitaxial layer may be eliminated and the transistors may be built directly in the substrate. In all embodiments described herein, the conductivity types may be reversed.

If desired, an N+ buried layer 23 may be formed at the interface of the N– epitaxial layer 22 and substrate 20, using well known techniques, to reduce the beta of any parasitic PNP bipolar transistor formed. A thin (e.g., 500 Angstroms) layer of gate oxide is then grown on the surface of the N– epitaxial layer 22. A layer of polysilicon is then deposited on the surface of the gate oxide 24 to a thickness of approximately 4,000 Angstroms and then defined using conventional photolithographic and etching techniques to produce the polysilicon gate 26. The polysilicon may be pre-doped or doped in a later doping step to be made conductive. In the preferred embodiment, the polysilicon is doped heavily N-type.

Boron ions are then implanted to form the P-type body 29. Drive-in of these ions may be performed next or in conjunction with later diffusion steps. In one embodiment, body 29 has an impurity concentration on the order of $1 \times E18$ ions/cm$^3$ and a depth of approximately 2.0 um, but this concentration and depth can vary considerably depending on the desired characteristics of the transistor. A P+ body contact 28 is then formed in the body 29 using ion implantation.

An N enhanced drift region 31 is then formed. The enhanced drift region 31 is engineered so that it purposely overlaps the lateral tail of the P-type body (layer). By making the poly gate length short enough that the enhanced drift region (layer 31) compensates the lateral tail of the P-type body (layer 29), one gets the very considerable advantage of much lower Ron*Area product (smaller device size factor).

The N enhanced drift region 31 substantially reduces on-resistance but does not significantly decrease the breakdown voltage. In one embodiment to form region 31, phosphorus ions are implanted, self-aligned with gate 26, at an energy of 70 KeV and a dosage of 1-5E13/cm$^2$, depending on the desired tradeoff between breakdown voltage and resistance. The dosage may even be as low as 1E12 for advantageous results to occur. The phosphorus ions are then driven in for 60 minutes at 1050° C. in a nitrogen atmosphere. The resulting depth of region 31 will be about 1.0 microns, and the surface concentration will be about 8E17 ions/cm$^3$. The sheet resistance of the resulting region 31 is about 900 ohms/square. Increasing the phosphorus concentration will lower the on-resistance.

An arsenic implantation process is then used to form the N+ source region 32 and N+ drain region 34. Metal source contact 37 and drain contact 38 are then formed by conventional techniques. Prior to the formation of the metal contacts, to optionally reduce the resistivity at the surface of the source region 32 and drain region 34, a layer of oxide (or other suitable material) may be deposited or grown over the surface of the wafer and then etched back to expose the surface of the source 32 and drain 34 regions while leaving a narrow oxide portion remaining around the gate 26 edges.

Figure 5:
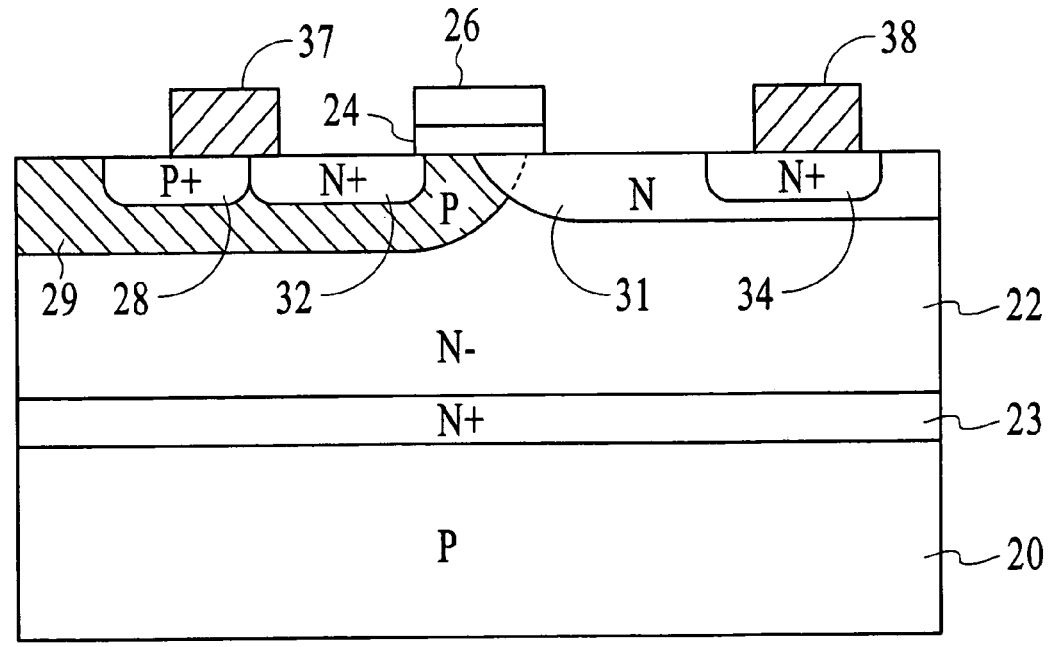
FIGS. 5-7 illustrate various embodiments of a LDMOS transistor in accordance with the present invention.
Figure 6:
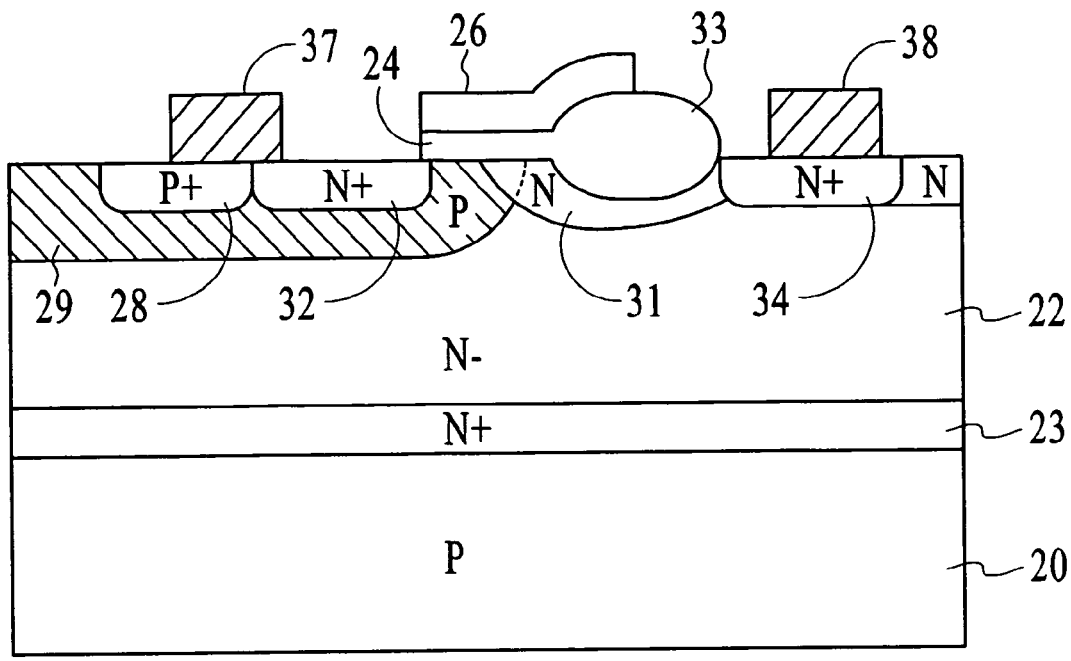
Figure 7:
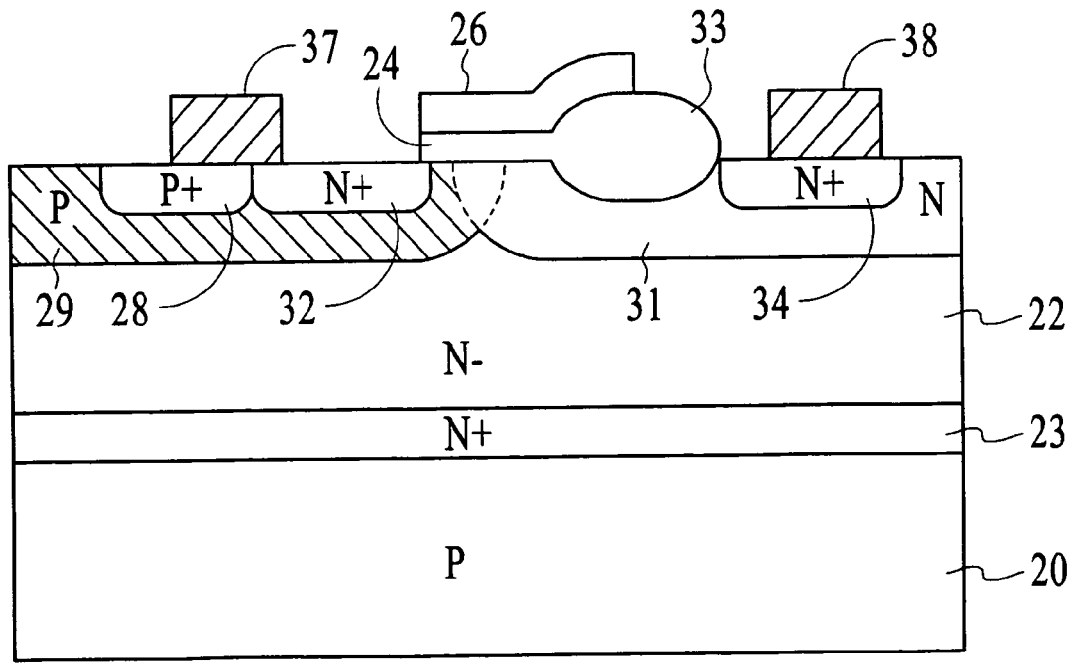

In another configuration, the N$^+$ drain region 34 may be formed within the N enhanced drift region 31, as shown in FIG. 5, if region 31 is made deeper. Furthermore, the gate oxide 24 under the drain side of gate 26 may include a field oxide region 33 (FIGS. 6 and 7) to reduce the Miller capacitance of the transistor and increase the breakdown voltage between the gate 26 and drain region 34.

While it is certainly advantageous to implant the enhanced drift region and the P– body self aligned to the polysilicon gate 26, it is not necessary. In one embodiment a relatively deep n region 31 is masked and implanted, followed by the P body 29 being masked and implanted. Then both the enhanced N region and the P– body can be driven simultaneously. The enhanced drift region would not be self aligned to the p– body, but would still provide the advantage of a reduced rdson*area product. By choosing the depth and separation of the n drift 31 and P body 29, one can optimize the rdson*area product and breakdown voltage. This non self aligned drift region and P– body scheme can be easily incorporated with a field oxide region 33 (FIG. 7), and is compatible with conventional processing techniques.

The N-channel DMOS transistors shown in FIGS. 4-7 can be made P-channel devices by changing the conductivity types of the substrate, epitaxial layer, and other regions. Additionally, a P-channel DMOS device may be formed in a P-well, where the P-well is formed within the N$^-$ epitaxial layer 22 or within an N$^+$ substrate. Conventional techniques may be used to form all regions, with the parameters of the various regions being adjusted for the intended application of the transistor.

In tests performed on transistors incorporating the N enhanced drift region 31, the $R_{on} \times$Area product (ohm-mils2) was approximately 40 for a $V_{GS}$ of 12 volts. The breakdown voltage of the device began at 25 volts. Devices having a breakdown voltage of 50 volts have also been built and tested with surprisingly good $R_{on} \times$Area results. Generally, allowing the n-drift region to overlap the DMOS body, results in a 30-50% improvement in Ron*Area product.

The breakdown voltage of the device is dependent upon the spacing between the drain and the gate and the total charge in the drift region. For a 100 cell device having an area of approximately 50,000 microns$^2$, a drift region dosage of 1.4E13 ions/cm$^2$, and an N+ drain-to-gate separation of 1.5 microns, the $R_{on}$ ($V_{GS}$=12 volts) was 0.5 ohms and the breakdown voltage was 25 volts. A larger N+ drain-to-gate separation did not significantly increase the breakdown voltage.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a lower Ron*product LDMOS device comprising the steps of:
   (a) providing a gate region on a substrate;
   (b) providing a body region on the substrate after the gate region has been provided, wherein the body region is underneath the gate region; and
   (c) providing an enhanced drift region under the gate region after the gate region has been provided, wherein the enhanced drift region purposely overlaps the body region, and wherein the drift region and the body region are both self-aligned to the gate region and therefore self-aligned to each other.

2. The method of claim 1 wherein the gate region is of such a length that the enhanced drift region purposely overlaps the body region when the enhanced drift region is implanted in the substrate.

3. The method of claim 1 wherein the body region is provided by implanting Boron ions into the substrate.

4. The method of claim 3 wherein the enhanced drift region is provided by implanting phosphorous ions that are self-aligned with the gate region into the substrate.

5. The method of claim 1 further comprising providing a drain region in the enhanced drift region and providing a source region in the body region.

6. The method of claim 5 wherein the drain region is entirely within the enhanced drift region.

7. The method of claim 6 further comprising providing a layer, well, or substrate under the enhanced drift region and the body region, wherein the layer, well, or substrate has the same conductivity type as the enhanced drift region.

8. The method of claim 1 wherein the conductivity type of the enhanced drift region is N-type.

9. The method of claim 1 wherein the conductivity type of the enhanced drift region is P-type.

10. The method of claim 1 wherein the providing of the enhanced drift region is performed after the body region has been provided on the substrate.

11. The method of claim 1 wherein the body region extends on the substrate away from a first side of the gate region, and the enhanced drift region extends on the substrate away from a second side of the gate region opposite to the first side.

12. A method for providing a lower Ron*product LDMOS device comprising the steps of:
   (a) providing a gate region on a substrate;
   (b) providing a body region on the substrate after the gate region has been provided, wherein the body region is underneath the gate region; and
   (c) implanting an enhanced drift region in the substrate under the gate region after the gate region has been provided, wherein the gate region is of a particular length such that the enhanced drift region, after implantation, purposely overlaps the lateral tail of the body region, and wherein the drift region and the body region are both self-aligned to the gate region and therefore self-aligned to each other.

13. The method of claim 12 wherein the body region is provided by implanting Boron ions into the substrate, and wherein the enhanced drift region is provided by implanting phosphorous ions that are self-aligned with the gate region into the substrate.

14. The method of claim 12 further comprising providing a drain region in the enhanced drift region and providing a source region in the body region.

15. The method of claim 14 wherein the drain region is entirely within the enhanced drift region and the enhanced drift region is under the entire drain region.

16. The method of claim 15 further comprising providing a layer, well, or substrate under the enhanced drift region and the body region, wherein the layer, well, or substrate has the same conductivity type as the enhanced drift region.

17. The method of claim 12 wherein the conductivity type of the enhanced drift region N-type.

18. The method of claim 12 wherein the conductivity type of the enhanced drift region P-type.

19. The method of claim 12 wherein the providing of the enhanced drift region is performed after the body region has been provided on the substrate.

20. The method of claim 12 wherein the body region extends on the substrate away from a first side of the gate region, and the enhanced drift region extends on the substrate away from a second side of the gate region opposite to the first side.

* * * * *